US006911711B1

(12) United States Patent
Shimabukuro et al.

(10) Patent No.: US 6,911,711 B1
(45) Date of Patent: Jun. 28, 2005

(54) MICRO-POWER SOURCE

(75) Inventors: Randy L. Shimabukuro, San Diego, CA (US); Stephen D. Russell, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/683,248

(22) Filed: Oct. 10, 2003

(51) Int. Cl.[7] ........................ H01L 31/115; H01L 21/00; G21H 1/00

(52) U.S. Cl. ........................ 257/429; 310/303; 310/305; 438/56

(58) Field of Search .......................... 257/429; 310/303, 310/305; 438/56

(56) References Cited

U.S. PATENT DOCUMENTS 2,847,585 A * 8/1958 Christian .................... 310/303
5,825,839 A * 10/1998 Baskis ........................ 376/320
6,700,298 B1 * 3/2004 Snyder et al. .............. 310/305

* cited by examiner

*Primary Examiner*—Howard Weiss
(74) *Attorney, Agent, or Firm*—Andrew J. Cameron; Michael A. Kagan; Peter A. Lipovsky

(57) ABSTRACT

A micro-power generator, comprises an electrically insulating substrate; a semiconductor layer affixed to the substrate; electrodes affixed to the semiconductor layer for collecting electrical charges emitted by a radioisotope source; a radioisotope source interposed between the electrodes; and electrical circuitry operably coupled to the electrodes for transforming the electrical charges into a controlled output.

20 Claims, 3 Drawing Sheets

MICRO-POWER SOURCE

BACKGROUND OF THE INVENTION

All electronic systems require electrical power in order to operate. For portable systems, typical sources of power are batteries which are sometimes augmented by solar cells for recharging. In the case of miniaturized sensors, the predominant limiting constraint on size, weight, volume and cost is the battery power source. Therefore, a need exists for alternative miniaturized energy sources.

BRIEF SUMMARY OF THE INVENTION

A micro-power generator, comprises an electrically insulating substrate; a semiconductor layer affixed to the substrate; electrodes affixed to the semiconductor layer for collecting electrical charges emitted by a radio-isotope source; a radio-isotope source interposed between the electrodes; and electrical circuitry operably coupled to the electrodes for transforming the electrical charges into a controlled output.

BRIEF DESCRIPTION OF THE SEVERAL VIEWS OF THE DRAWINGS

Throughout the figures, like elements are referenced using like references.

DETAILED DESCRIPTION OF THE INVENTION

Figure 1:
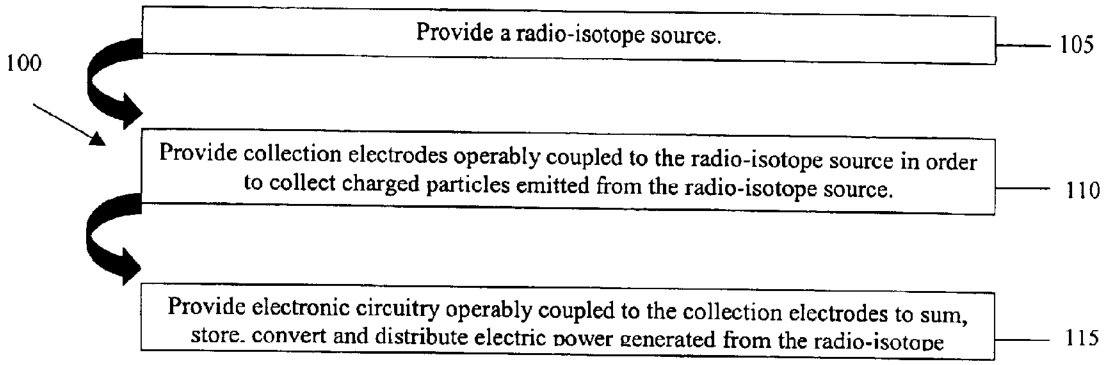
FIG. 1 shows a schematic process for implementing a radio-isotope powered micro-power source that embodies various features of the present invention.

A micro-power source embodying various features of the present invention is a radioisotope-based apparatus that exploits microelectronic processing techniques to miniaturize the structure and collect and distribute electrical energy. FIG. 1 shows a schematic process 100 of implementing the micro-power source. A radio-isotope source 105, as for example a $Ni^{63}$ source with a half-life of about 70 to 100 years, emits electrons with energy of about 17 keV through well-known beta-decay. The radio-isotope source may be formed in a quasi-planar geometry compatible with micro-fabrication techniques such as deposition and patterning or electro-plating on a wafer surface. Collection electrodes 110 operably coupled to the radio-isotope source 105 collect charged particles emitted from the radio-isotope source 105. Such collection electrodes 110 may be formed in a hemi-spherical configuration, cylindrical, planar, or other geometry in order to intercept a desired number of emitted charged particles as described below in more detail. Electronic circuitry 115 operably coupled to the collection electrodes 110 sums, stores, converts, and distributes electric power generated from the radio-isotope source 105. The conversion and distribution process performed by electronic circuitry 115 may include DC to DC voltage converter circuitry and/or charge-pumping circuitry may be employed to step-down high voltage charges that may be achieved on the collection electrodes 110 to a lower voltage current source. The electrical circuitry 115 may be operably connected to external devices or systems (not shown) that require electrical power.

Figure 2:
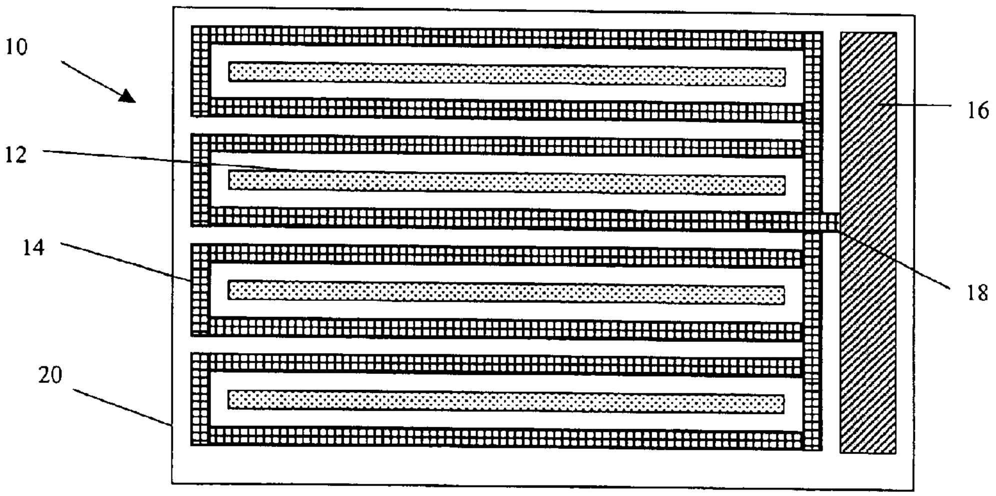
FIG. 2 shows an embodiment of a micro-power source.

FIG. 2 shows one embodiment of the micro-power source 10. Substrate 20 is a dielectric, such as a silicon-on-insulator (SOI) wafer. Electronic circuitry 16 is formed on the SOI wafer by well-established techniques described in the prior art. See for example: R. L. Shimabukuro, et al., U.S. Pat. 6,617,187 entitled "Method For Fabricating An Electrically Addressable Silicon-On-Sapphire Light Valve," issued 9 Sep. 2003 and S. D. Russell, et al, U.S. Pat. 6,372,592 entitled "Self-Aligned MOSFET With Electrically-Active Mask, issued 16 Apr. 2002. Electronic circuitry 16 may be designed to sum, store, convert and distribute electric power generated from the radio-isotope source 12. Electronic circuitry 16 may include charge-pumping circuitry that includes Buck converters for down-converting high-voltages to one or more on-chip operating voltages, as desired. Radio-isotope source 12 may be formed on the substrate 20 using any of several different methods. One technique of forming radio-isotope source 12 on the substrate 20 is the sputter deposition of nickel (Ni) onto the surface of substrate 20. Then the nickel may be patterned and etched using photo-lithographic techniques to achieve the desired geometry. Then neutron irradiation of the nickel may be used to transmute the nickel into $Ni^{63}$,the radioactive form, to create the source of charged particles. Another technique of forming radio-isotope source 12 is to electroplate nickel onto the surface using a well-known process such as LIGA, which is amenable to thicker layers (macro fabrication). Neutron irradiation may be used to transmute the nickel into $Ni^{63}$, the radioactive form, to create the source of charged particles. Yet another alternative of forming radio-isotope source 12 on surface of substrate 20 is to directly electroplate $Ni^{63}$ onto the substrate 20 to avoid the neutron irradiation step. In some embodiments (not shown in FIG. 2 or 3), radio-isotope source 12 may be electrically connected to ground, to avoid floating charge effects and serve as a voltage reference. Collection electrodes 14 are also formed on substrate 20, configured as desired to maximize the collection of emitted charge particles from radio-isotope source 12, or to collect at least some of the emitted charged particles. The collection electrodes 14 may be formed in a capacitor structure as a first means of collecting charge. One technique of forming collection electrodes 14 is the sputter deposition of a conductive material (such as a metal including aluminum, nickel, and the like) onto the surface of substrate 20. Then the conductive material is patterned and etched using photolithographic techniques to achieve the desired geometry for the collection electrodes 14. Another technique for forming collection electrodes 14 is to electroplate the conductive material onto the surface of substrate 20 using LIGA, a well know process, which is amenable to thicker layer fabrication (macro fabrication). An interconnection 18 is formed to operably couple the collection electrodes 14 to electronic circuitry 16. The interconnection 18 may be formed simultaneously with the formation of the collection electrodes 14 and may be made of any suitable electrically conductive material.

Figure 3:
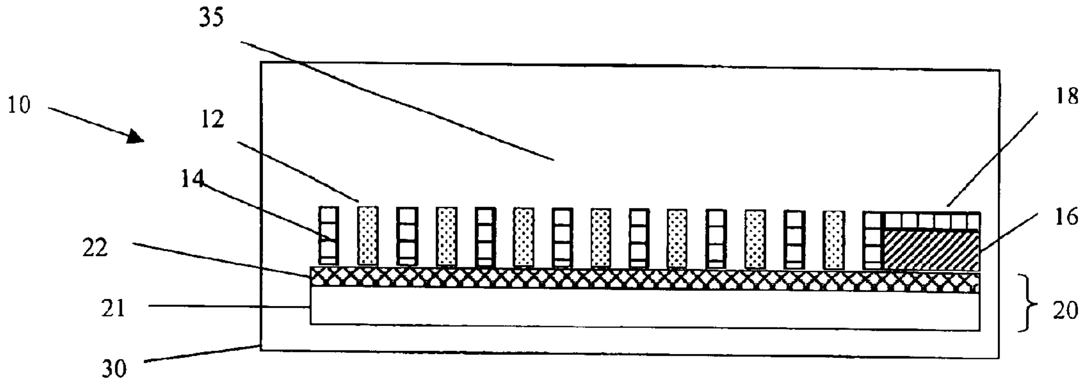
FIG. 3 shows a schematic cross-section of the micro-power source of FIG. 2

FIG. 3 shows a schematic cross-section of micro-power source 10. Substrate 20 is shown as an SOI wafer, comprising a silicon-layer 22 and an insulating portion 21 which could be sapphire or a silicon-dioxide layer on silicon. Collection electrodes 14 are shown in a quasi-planar geometry interdigitated with radio-isotope sources 12. Monolithically formed electronic circuitry 16 is shown operably coupled to collection electrodes 14 through interconnection 18. While the level of ionizing radiation is very low, and the energy insufficient to penetrate biological tissue in any great extent, the micro-power source 10 may be packaged 30 to further ensure no radiation escapes into the environment by using an absorbing material with a high atomic number in the package (such as paraffin). Analogous techniques are used to protect microelectronic circuitry from absorbing ionizing radiation from the external environment, for example when used in space environments. In this case similar materials may be employed in the opposite need, to protect the environment from the ionizing radiation. Also shown within package 30 is environment 35. Environment 35 may, if desired, be at least partially evacuated to increase the mean-free-path of the charge particles emitted from radio-isotope sources 12. This maybe employed to improve the collection efficiency of the micro-power device 10.

Figure 4:
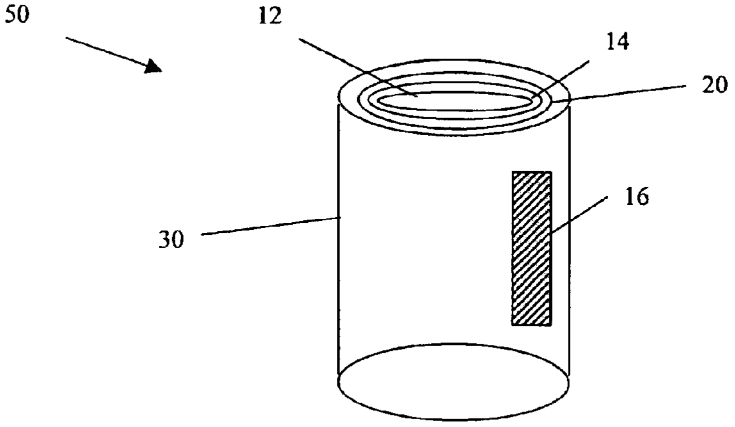
FIG. 4 shows another embodiment of the micro-power source.

FIG. 4 shows another embodiment of the micro-power source. In this embodiment, following the fabrication of the key portions on substrate 20, the substrate is thinned in order to form a 3D cylindrical structure analogous to a conventional 1.5 volt battery. Techniques for forming the flexible microelectronic wafer are described in co-pending application: P. M. Sullivan and S. D. Russell entitled "Flexible Display Apparatus and Method", Navy Case No. 79,797, patent pending.

Figure 5:
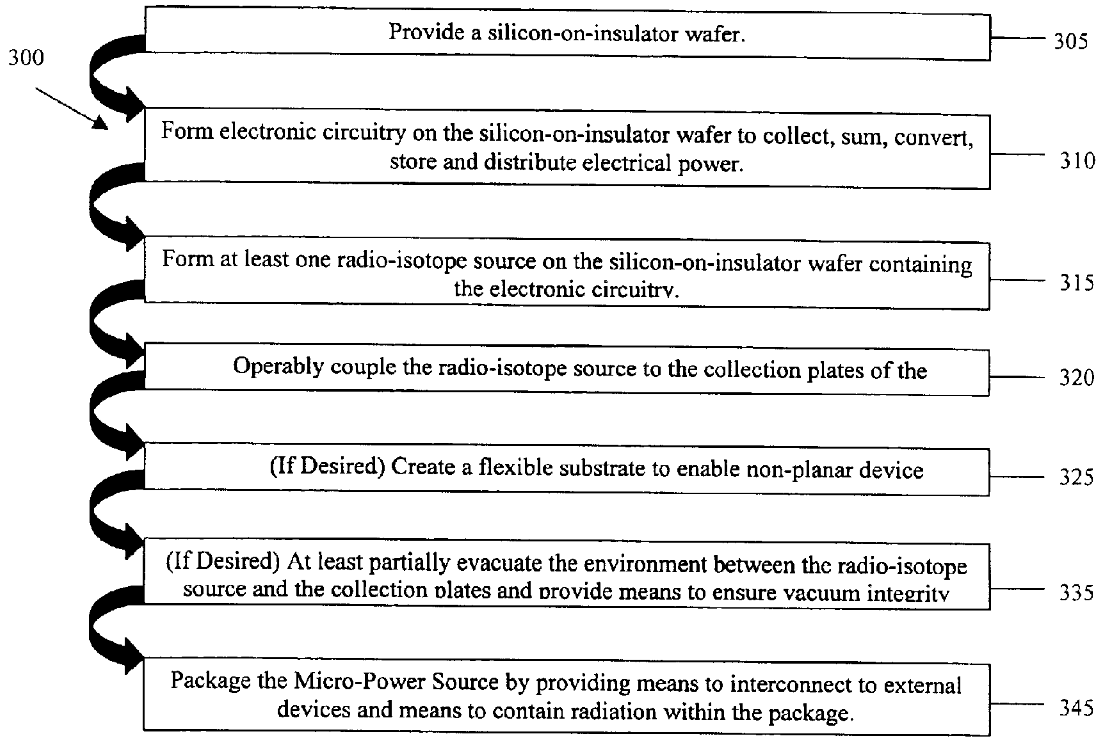
FIG. 5 schematically represents an embodiment of a fabrication process for manufacturing a micro-power source.

FIG. 5 schematically describes a fabrication process 300 for forming the micro-power source 10. At step 310, electronic circuitry is formed on a dielectric substrate such as a SOI wafer to collect, sum, convert, store and distribute electrical power. Then, at least one radio-isotope source is formed on the SOI wafer at step 315. Next, the radio-isotope source is electrically interconnected, or operably coupled to the collection plates of the electronic circuitry at step 320. If desired, a flexible substrate is created at step 325 to allow micro-power source to have non-planar device geometries. Non-planar implies a region of a surface having a finite radius of curvature. In one embodiment, the environment between the radio isotope source and the collection plates may be partially evacuated at optional step 335 by which a partial vacuum may be maintained in the environment by use, for example, of a seal. At step 345 the micro-power source is enclosed in a package that includes an interconnect is electrically to the micro-power source so that the micro-power source may be electrically connected to external devices (not shown). The package also serves to contain radiation within the package.

Thus, it may be appreciated that a micro-power source based on generation of charges by a radio-isotope and collection of such charges may be interconnected to microelectronic circuitry. The micro-power source may be monolithically formed on a single SOI chip, and can be configured in quasi-2D or 3D configurations. The micro-power source may also be rolled into a form factor similar to a conventional chemical battery, or concatenated by a multi-layer stack of micro-power sources.

The structure of radio-isotope source 105 may be planar, i.e quasi-2D lying substantially in the plane of the wafer, or non-planar, i.e. 3D structures fabricated above a wafer surface or configured into cylinders or other 3D shapes. Three dimensional structures may be formed by alternating layers of radio-isotope source and collection electrodes with desired dielectric spacers. Spacers may be formed using techniques common in micro fabrication and MEMS fabrication including the use of sacrificial layers which can be removed to form voids in the structure that can contained a desired environment (e.g. partial vacuum). The electronic circuitry may be monolithically fabricated below or adjacent to the radio-isotope and collection capacitors, or bonded or otherwise operably coupled. In some embodiments, it is advantageous to have off-chip electronics in order to maximize collection efficiency from the radio-isotope source. Such configurations are design trade-offs based on the teachings herein. Other materials, polymer coatings, biasing sources, capacitive read-out, integrated electronics can be used in this invention, but the simplest embodiments were described to convey the operational concept.

A micro-power generator includes an electrically insulating substrate; a semiconductor layer affixed to the substrate; electrodes affixed to the semiconductor layer for collecting electrical charges emitted by a radioisotope source; a radio-isotope source interposed between the electrodes; and electrical circuitry operably coupled to the electrodes for transforming the electrical charges into a controlled output, which may be a voltage signal or a current signal. In one embodiment, the radio-isotope source may emit electrical charges that are electrons. In another embodiment, the radio-isotope source may emit electrical charges that are alpha-particles. The semiconductor layer may include a Group IV element. The insulating substrate may be selected from the group that includes sapphire, silicon dioxide, silicon nitride. The electrodes may include a material selected from the group that includes nickel, aluminum, copper, gold, silver, titanium, and palladium.

In one embodiment, a dielectric, such as solid structure or a gas, may be interposed between the radioisotope source and the electrodes. The solid structure may include compounds selected from the group that includes silicon dioxide, silicon nitride, alumina, and polyimides.

An example of a gaseous dielectric is air, but other electrically insulating gases and gas mixtures, such as inert gases, may also be employed. By way of example, absolute pressure of the gas or gas mixture may be no greater than atmospheric pressure.

In one embodiment, the electrical circuitry may be affixed to the semiconductor layer. In another embodiment, the electrical circuitry may be formed from the semiconductor layer to create a monolithically integrated structure.

Obviously, many modifications and variations of the present invention are possible in light of the above teachings. It is therefore to be understood that within the scope of the appended claims, the invention may be practiced otherwise than as specifically described.

We claim:

1. A micro-power generator, comprising:

an electrically insulating substrate;

a semiconductor layer affixed to said substrate;

electrodes affixed to said semiconductor layer for collecting electrical charges emitted by a radioisotope source;

a radio-isotope source interposed between said electrodes; and electrical circuitry operably coupled to said electrodes for transforming said electrical charges into a controlled output.

2. The micro-power generator of claim 1 wherein said controlled output is a voltage signal.

3. The micro-power generator of claim 1 wherein said controlled output is a current signal.

4. The micro-power generator of claim 1 further including a radio-isotope source for generating said electrical charges.

5. The micro-power generator of claim 1 wherein said electrical charges are electrons.

6. The micro-power generator of claim 1 wherein said electrical charges are alpha-particles.

7. The micro-power generator of claim 1 wherein said semiconductor layer includes a Group IV element.

8. The micro-power generator of claim 1 wherein said insulating substrate is selected from the group that includes sapphire, silicon dioxide, silicon nitride.

9. The micro-power generator of claim 1 wherein said electrodes include a material selected from the group that includes nickel, aluminum, copper, gold, silver, titanium, and palladium.

10. The micro-power generator of claim 1 wherein a dielectric is interposed between said radioisotope source and said electrodes.

11. The micro-power generator of claim 10 wherein said dielectric is a solid structure.

12. The micro-power generator of claim 11 wherein said solid structure includes compounds selected from the group that includes silicon dioxide, silicon nitride, alumina, and polyimides.

13. The micro-power generator of claim 10 wherein said dielectric is a gas.

14. The micro-power generator of claim 13 wherein said gas is air.

15. The micro-power generator of claim 14 wherein said gas substantially includes an inert gas.

16. The micro-power generator of claim 13 wherein said gas has an absolute pressure that is no greater than atmospheric pressure.

17. The micro-power generator of claim 1 wherein said electrical circuitry is affixed to said semiconductor layer.

18. The micro-power generator of claim 1 wherein said electrical circuitry is formed from said semiconductor layer to create a monolithically integrated structure.

19. The micro-power generator of claim 1 wherein said electrically insulating substrate is non-planar.

20. The micro-power generator of claim 1 wherein said electrically insulating substrate is generally planar.

* * * * *